United States Patent
Zhu et al.

(10) Patent No.: US 8,026,773 B2
(45) Date of Patent: *Sep. 27, 2011

(54) SYSTEM AND METHOD FOR A DIGITALLY TUNABLE IMPEDANCE MATCHING NETWORK

(75) Inventors: Xu Zhu, Allen, TX (US); Michael Brobston, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 180 days.

This patent is subject to a terminal disclaimer.

(21) Appl. No.: 12/070,553

(22) Filed: Feb. 19, 2008

(65) Prior Publication Data

US 2008/0218291 A1    Sep. 11, 2008

Related U.S. Application Data

(63) Continuation of application No. 11/232,663, filed on Sep. 22, 2005, now Pat. No. 7,332,980.

(51) Int. Cl.
  *H03H 7/38* (2006.01)
(52) U.S. Cl. ......... 333/32
(58) Field of Classification Search ........ 333/32, 333/33, 17.3
  See application file for complete search history.

(56) References Cited

U.S. PATENT DOCUMENTS

| | | | |
|---|---|---|---|
| 5,808,527 A | 9/1998 | De Los Santos | |
| 5,923,297 A | 7/1999 | Kim et al. | |
| 6,526,263 B1 | 2/2003 | Saito | |
| 6,646,525 B2 | 11/2003 | Bozler et al. | |
| 6,670,864 B2* | 12/2003 | Hyvonen et al. | 333/32 |
| 6,738,603 B1 | 5/2004 | Saito | |
| 6,746,891 B2 | 6/2004 | Cunningham et al. | |
| 6,847,114 B2 | 1/2005 | Sett et al. | |
| 6,876,047 B2 | 4/2005 | Cunningham et al. | |
| 6,876,482 B2 | 4/2005 | DeReus | |
| 6,882,264 B2 | 4/2005 | Cunningham | |
| 6,897,537 B2 | 5/2005 | de los Santos | |
| 6,917,086 B2 | 7/2005 | Cunningham et al. | |
| 7,187,249 B2* | 3/2007 | Nicholson et al. | 333/33 |
| 7,332,980 B2* | 2/2008 | Zhu et al. | 333/17.3 |
| 2002/0030566 A1 | 3/2002 | Bozler et al. | |
| 2002/0086456 A1 | 7/2002 | Cunningham et al. | |
| 2002/0104990 A1 | 8/2002 | DeReus et al. | |
| 2002/0113281 A1 | 8/2002 | Cunningham et al. | |
| 2002/0118075 A1 | 8/2002 | Ohwada et al. | |
| 2002/0181838 A1 | 12/2002 | Cunningham et al. | |
| 2003/0021004 A1 | 1/2003 | Cunningham et al. | |
| 2003/0116848 A1 | 6/2003 | Cunningham et al. | |
| 2003/0116851 A1 | 6/2003 | Sett et al. | |
| 2003/0117257 A1 | 6/2003 | Cunningham | |
| 2003/0119221 A1 | 6/2003 | Cunningham et al. | |
| 2004/0009754 A1 | 1/2004 | Smith, Jr. | |
| 2004/0012298 A1 | 1/2004 | Cunningham et al. | |
| 2004/0036558 A1 | 2/2004 | Allison et al. | |
| 2004/0188785 A1 | 9/2004 | Cunningham et al. | |
| 2004/0197960 A1 | 10/2004 | Sett et al. | |
| 2005/0007291 A1 | 1/2005 | Fabrega-Sanchez et al. | |
| 2005/0057399 A1 | 3/2005 | Kipnis et al. | |
| 2005/0130699 A1 | 6/2005 | Kim | |

* cited by examiner

*Primary Examiner* — Stephen Jones

(57) ABSTRACT

The present disclosure relates generally to digitally tunable impedance matching networks. In one example, a digitally tunable impedance matching network is configured to produce an overall reactance value of approximately X, and includes multiple reactive components that are configured to produce a reactance value in the range of approximately zero to X with a minimum resolution of approximately $X/2^n$.

21 Claims, 8 Drawing Sheets

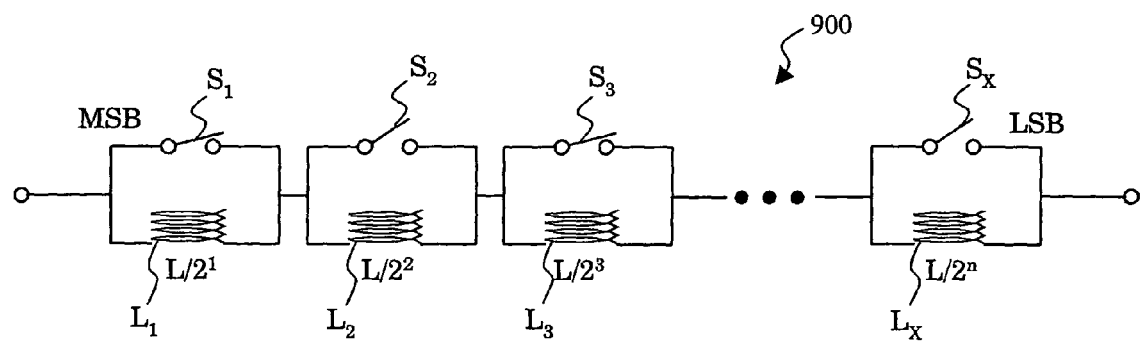
Fig. 9
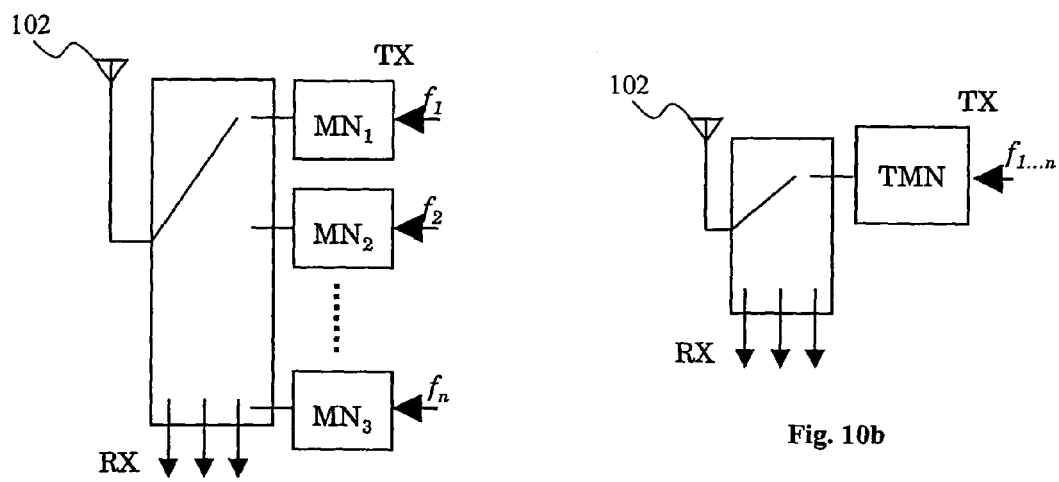
Fig. 10a
Fig. 10b

SYSTEM AND METHOD FOR A DIGITALLY TUNABLE IMPEDANCE MATCHING NETWORK

CROSS-REFERENCE TO RELATED APPLICATION AND CLAIM OF PRIORITY

The present invention is a continuation of prior U.S. patent application Ser. No. 11/232,663, filed on Sep. 22, 2005, now U.S. Pat. No. 7,332,980 entitled "System and Method for a Digitally Tunable Impedance Matching Network." U.S. patent application Ser. No. 11/232,663 is assigned to the assignee of the present application. The subject matter disclosed in U.S. patent application Ser. No. 11/232,663 is hereby incorporated by reference into the present disclosure as if fully set forth herein. The present invention hereby claims priority under 35 U.S.C. §120 to U.S. patent application Ser. No. 11/232,663.

BACKGROUND

Impedance matching is used to match the impedance of a source with the impedance of a load circuit. As is known, matching the impedance of the source and load enables the maximum amount of power to be transferred from the source to the load for a given signal. However, antenna impedance matching presents particular difficulties in mobile devices, such as mobile handsets, due to the constantly changing environment in which such devices may operate. The changing environment can result in large changes in the antenna impedance that cause a fixed matching network to be ineffective in providing an optimum impedance match between the antenna and the front end circuitry of the mobile device.

Therefore, what is needed is a new and improved system for impedance matching in a mobile device and a method for using such a system.

SUMMARY

In one embodiment, an impedance matching system is provided. The system comprises a digitally tunable impedance matching network having a maximum capacitance C and a digital controller. The network includes first and second capacitors. The first capacitor has a fixed plate and a moveable plate configured to be in a first position or a second position, where the first capacitor provides a predefined value of capacitance C/2 when the movable plate is in the first position and an open circuit when the movable plate is in the second position. The second capacitor is coupled in parallel to the first capacitor and has a fixed plate and a moveable plate configured to be in a first position or a second position, where the second capacitor provides a predefined value of capacitance equal to approximately $C/2^n$ (where $n>=2$) when the movable plate is in the first position and an open circuit when the movable plate is in the second position. The digital controller is coupled to the first and second capacitors and configured to actuate the moveable plate of one or both of the first and second capacitors to produce a capacitance in the range of $C/2^n$ to $(C/2)+(C/2^n)$.

In another embodiment, an impedance matching network configured to produce a maximum reactance value of X is provided. The network comprises a plurality of reactive elements each having a reactance value $X/2^n$ (where $1<=n<=$ total number of reactive elements (nmax)) and the reactance value of each reactive element is smaller than the reactance value of the next largest reactive element by a factor of 2. Each of the reactive elements is coupled to a controller and configured to be individually actuated by the controller to tune the digitally tunable impedance matching network to have a reactance value ranging from approximately zero to X in steps of approximately $X/2^{nmax}$.

In still another embodiment, a system for receiving and transmitting information is provided. The system comprises an antenna, a front-end module coupled to the antenna, a low noise amplifier, a power amplifier, and a digitally tunable impedance matching circuit. The low noise amplifier is coupled to the front-end module to form a reception path for information received from the antenna. The power amplifier is coupled to the front-end module to form a transmission path for information sent to the antenna. The digitally tunable impedance matching circuit is coupled between the front-end module and at least one of the antenna, the low noise amplifier, and the power amplifier. The digitally tunable impedance matching circuit has a maximum reactance value of X and is comprised of a plurality of reactive elements having sequential reactance values differing by a factor of two and ranging from a largest reactance value of X/2 to a smallest reactance value of $X/2^n$, where $n>=2$.

In yet another embodiment a method for matching a target impedance is provided. The method comprises calculating a matching impedance needed to match a target impedance, converting the matching impedance to a binary signal based on a minimum resolution of an impedance network to be used for producing the matching impedance, sending the binary signal to at least one actuator associated with a reactive element, and actuating the reactive element using the at least one actuator to substantially produce the matching impedance using the impedance network.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 9 is a circuit diagram of an embodiment of an inductor-based digitally tunable matching network that may be used within the system of FIG. 1.

FIG. 10a is a diagram illustrating the use of multiple matching networks in a multi-band power amplifier environment.

FIG. 10b is a diagram illustrating the use of a single digitally tunable impedance matching network in place of the multiple matching networks of FIG. 10a.

FIG. 13b is a diagram illustrating the use of a single digitally tunable impedance matching network in place of the multiple matching networks of FIG. 13a.

DETAILED DESCRIPTION

Figure 1:
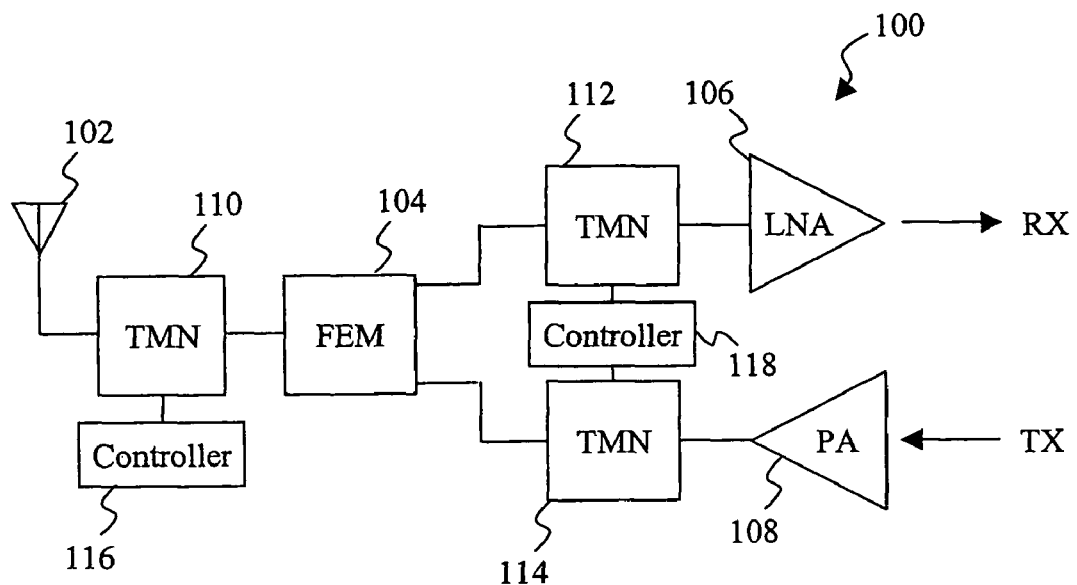
FIG. 1 is a diagram of a system containing digitally tunable matching networks for matching the impedance of various components.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, in one embodiment, a system 100 is configured to provide for the transmission and reception of information via an antenna 102. For example, the system 100 may be integrated into a mobile handset (e.g., a cell phone) capable of transmitting voice and/or data in a wireless network utilizing a technology such as Code Division Multiple Access (CDMA), Global System for Mobile communication (GSM), Orthogonal Frequency Division Multiplexing (OFDM), or similar communications technologies.

In addition to the antenna 102, the system 100 includes a front-end module (FEM) 104, a low noise amplifier (LNA) 106, and a power amplifier (PA) 108. The antenna 102, FEM 104, and LNA 106 are coupled to form a reception channel whereby data and voice communications received via the antenna 102 are directed to other circuitry (not shown) within the system 100. Similarly, the PA 108, FEM 104, and antenna 102 are coupled to form a transmission channel whereby data and voice communications are sent from other circuitry (not shown) within the system 100 for transmission via the antenna 102.

In some environments, such as a cell phone handset, the system 100 is generally designed to have its radio frequency (RF) transmit/receive impedance match the impedance of the antenna 102 based on a non-reflective environment. In most realistic handset environments the RF impedance may change over time and may vary greatly from that of the non-reflective environment due to factors such as the location of walls, ceilings, or other reflective objects, whether the handset is placed close to the head, the location of the user's fingers relative to the antenna 102, and whether the handset is a flip phone or a slider phone that is closed. Such conditions, which can affect handset performance and quality of communication, may be viewed in terms of their impact on the voltage standing wave ratio (VSWR), which measures the efficiency of an antenna system in terms of the energy that is projected by the system and the energy reflected back to the antenna.

More specifically, a poor VSWR is associated with performance degradation in the handset due to the impedance mismatch between the FEM 104, LNA 106, and PA 108. For example, a change in source or load impedance seen by a duplexer within the FEM 104 can cause power loss and detune the duplexer response. A source impedance mismatch from the antenna 102 as seen by the LNA 106 can result in noise figure degradation in the LNA, which may result in sensitivity degradation. Likewise, load impedance variation seen by the PA 108 can result in power loss and linearity degradation. Degradation in linearity in the PA 108 may result in a degraded adjacent channel power ratio (ACPR), which may cause the handset to fail to comply with various regulatory agency or standards requirements.

Generally, a fixed antenna matching network is unable to adapt and provide sufficient impedance matching of the antenna 102 into the radio front-end components such as the FEM 104, LNA 106, and PA 108. Furthermore, the use of variable reactive elements (e.g., variable capacitors implemented using discrete semiconductor varactors, digitally tunable ferroelectric dielectric ceramics, or a discrete capacitor array controlled using switches), fail to adequately match the impedance.

Accordingly, the system 100 includes three digitally tunable matching networks 110, 112, and 114. It is understood that the digitally tunable matching networks 110, 112, and 114 may be implemented as a single network or as additional, smaller networks if desired, and are presented in the present example as three separate networks for purposes of illustration only. As will be described later in greater detail, the digitally tunable matching networks 110, 112, and 114 each operate to match the impedance between components of the system 100. More specifically, the digitally tunable matching network 110 is configured to match the impedance between the antenna 102 and FEM 104, the digitally tunable matching network 112 is configured to match the impedance between the FEM 104 and LNA 106, and the digitally tunable matching network 114 is configured to match the impedance between the FEM 104 and the PA 108.

As will be described below in greater detail with specific examples, each of the digitally tunable matching networks 110, 112, and 114 includes multiple reactive (e.g., reactance producing) elements that may be switched between two states: ON and OFF. Each of the reactive elements in a single digitally tunable matching network is related to the other reactive elements in the network based on a $2^n$ relationship. More specifically, a digitally tunable matching network has a maximum capacitive or inductive value MAX, and the reactive elements approximate that value when all of them are ON. The largest reactive element is approximately equal to the maximum value divided by a predefined factor (e.g., $2^1$), and the values of the remaining elements sequentially decrease by the predefined factor. For example, eight reactive elements may have the values of $MAX/2^1$, $MAX/2^2$, $MAX/2^3$, $MAX/2^4$, $MAX/2^5$, $MAX/2^6$, $MAX/2^7$, and $MAX/2^8$. Controlling the state of the different reactive elements enables reactance values in the range of approximately $MAX/2^8$ to MAX to be selected in steps of $MAX/2^8$. Accordingly, adding more reactive elements to such a digitally tunable matching network may permit a greater resolution (as MAX/$2^n$ is smaller) during impedance matching. Although the following examples use a single type of reactive element (either capacitors or inductors), it is understood that some embodiments may include both capacitors and inductors.

Two digital controllers 116 and 118 may be used to provide control signals to the digitally tunable matching networks 110, 112, and 114. It is understood that a single digital controller may control multiple digitally tunable matching networks (as with the controller 118), or a controller may control a single digitally tunable matching network (as with the controller 116). Furthermore, a controller may be integrated with a digitally tunable matching network or with another component, or may be a stand alone controller as illustrated. Such controllers may be programmable, enabling the use of a single controller architecture for different types of matching networks, or may be customized for a particular network type (e.g., as an application specific integrated circuit (ASIC)). The controller may contain the capability to detect and measure the magnitude and/or phase of signal reflections and use these measurements to determine the appropriate capacitor and/or inductor values to select in the matching network. In addition, a controller may perform various calculations (e.g., to identify which capacitors or inductors of a matching network should be used to match a particular impedance) or may simply receive instructions such as ON/OFF from another component and tune the matching network based on those instructions.

Figure 2:
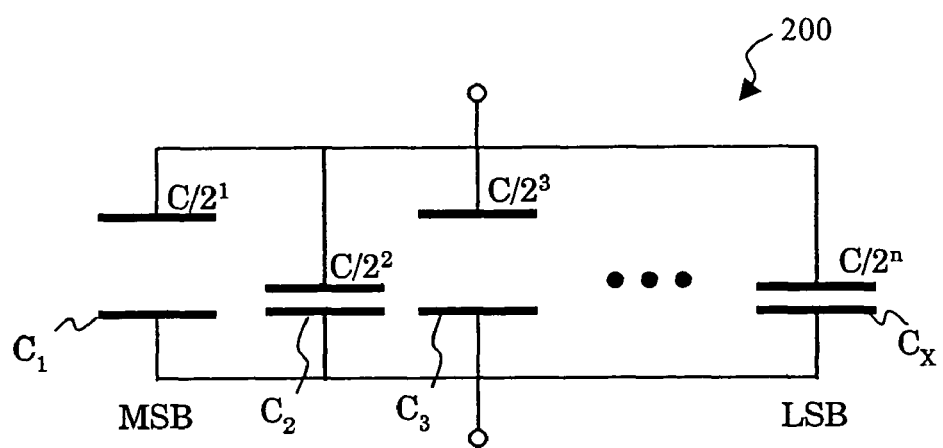
FIG. 2 is a circuit diagram of one embodiment of a capacitor-based digitally tunable matching network that may be used within the system of FIG. 1.

Referring to FIG. 2, a circuit 200 illustrates one embodiment of a digitally tunable matching network. In the present example, the circuit 200 is based on digitally tunable capacitors $C_1, C_2, C_3, \ldots, C_X$ that may be either ON or OFF. Each capacitor $C_1, C_2, C_3, \ldots, C_X$ is coupled in parallel to the other capacitors and has a predefined capacitive value that is related to the other capacitor values based on a $2^n$ relationship. More specifically, the entire matching network is designed to have an overall capacitive value of C when all of the capacitors $C_1, C_2, C_3, \ldots, C_X$ are ON. The largest capacitor in the network (the capacitor $C_1$) has a capacitive value of C/2 (or $C/2^n$ where n=1). Each capacitor decreases in capacitive value by a fixed amount, such as a factor of 2, and the smallest capacitor in the network (the capacitor $C_X$) provides the resolution of the network (e.g., the smallest amount by which the capacitive value can be increased or decreased). For example, if the capacitor $C_X$ has a value of $C/2^n$ and n=8, then the smallest step size of capacitance allowed by the network is 1/256 of C. Therefore, the circuit 200 can provide a range of capacitances from approximately C/256 to C in steps of C/256. It is understood that C may be selected to be a slightly larger value than desired for the total capacitance, as the above example may actually provide a maximum capacitance of C−(C/256), rather than C, depending on the exact capacitor values as manufactured. Furthermore, it is understood that the designation of the overall capacitive value as C is for purposes of example only, and the designation of C may be altered. For example, the overall capacitive value C may be represented as 2C, which means that the largest capacitor has a value of C, rather than C/2.

In the present example, the capacitors $C_1, C_2, C_3, \ldots, C_X$ are controlled according to a binary array, with the largest capacitor $C_1$ controlled by the most significant bit (MSB) and the smallest capacitor $C_X$ controlled by the least significant bit (LSB). As will be described below with respect to FIG. 4, each capacitor is implemented so that the capacitor either contributes to the capacitive network (ON) or does not contribute to the capacitive network (OFF). Therefore, the state of each capacitor may be viewed as a binary switch with the value of each bit representing a capacitor indicating whether the corresponding capacitor is ON or OFF. Furthermore, this binary representation may be used to calculate the capacitance by representing OFF using a zero and ON using a one (or vice versa). Accordingly, referring to FIG. 2, assuming that $C^1$ and $C^3$ are OFF and $C^2$ and $C^4$ are ON, then the calculation of capacitance for the four capacitors shown in FIG. 2 may be $(0*C./2)+(1*C./2^2)+(0*C./2^3)+(1*C./2^n)=C/4+C/2^n$.

Figure 3:
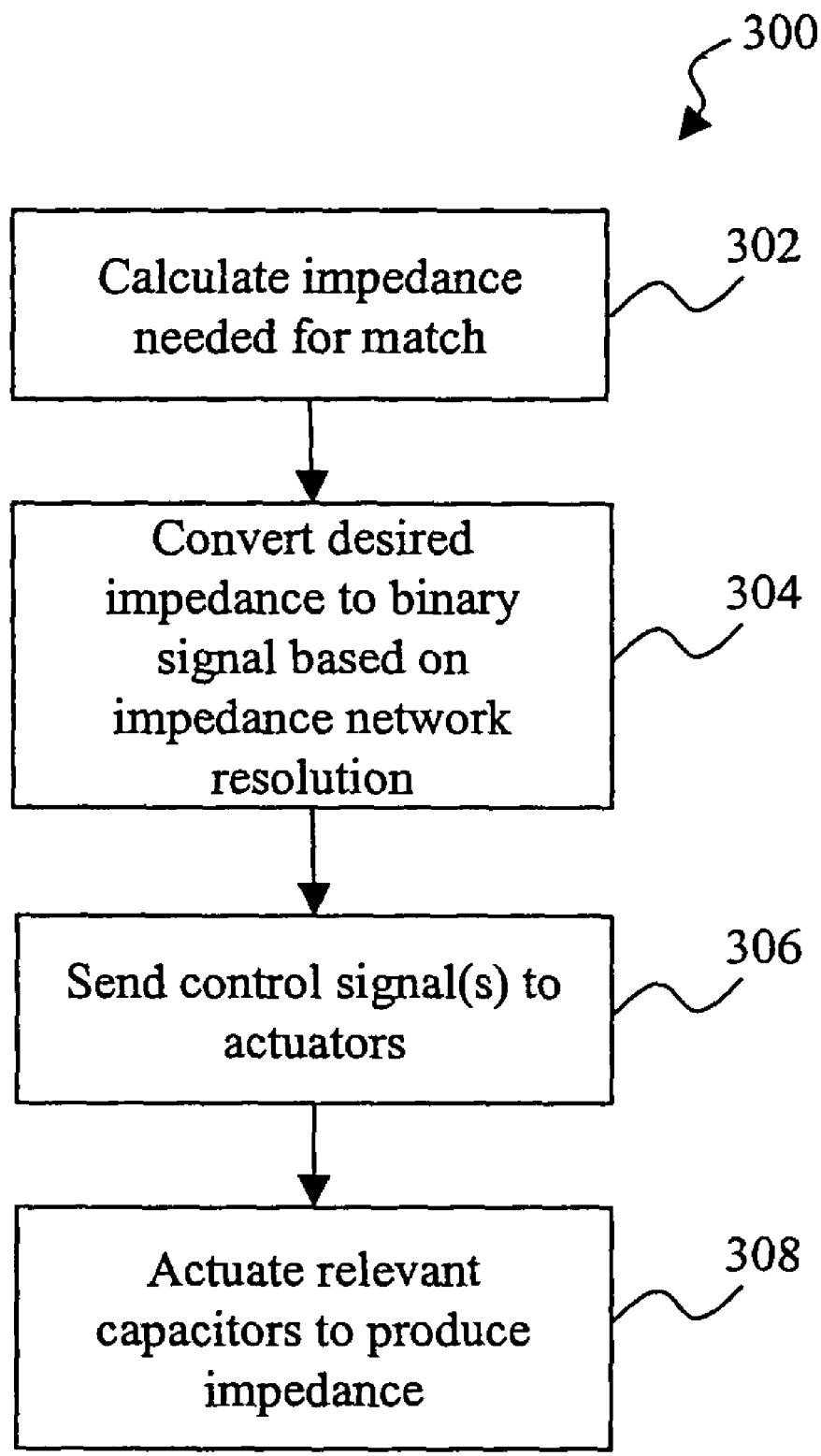
FIG. 3 is a flowchart of a method that may be executed within the system of FIG. 1 for impedance matching.

Referring to FIG. 3, a method 300 illustrates one embodiment of a method that may be used within the circuit of FIG. 3 to provide a matching impedance. In step 302, an impedance needed for a match is calculated. For example, the method 300 may be executed to calculate an impedance needed to match the FEM 104 of FIG. 1 with the antenna 102. In step 304, the desired impedance is converted to a binary signal based on the impedance network's resolution. Using the circuit of FIG. 2 as an example, the desired impedance would be calculated based on a resolution of $C/2^n$.

In step 306, a control signal (or multiple control signals depending on the specific implementation) is sent to an actuator associated with each of the capacitors that is to be turned on. For the example described with respect to FIG. 2 where a capacitance of $C/4+C/2^n$ was desired, such a signal may be a binary signal 0101, indicating the capacitors $C_2$ and $C_X$ are to be turned on (or remain on) and the capacitors $C_1$ and $C_3$ are to be turned off (or remain off). In step 308, the relevant actuators are used to turn on their associated capacitor and produce the desired impedance.

Figure 4:
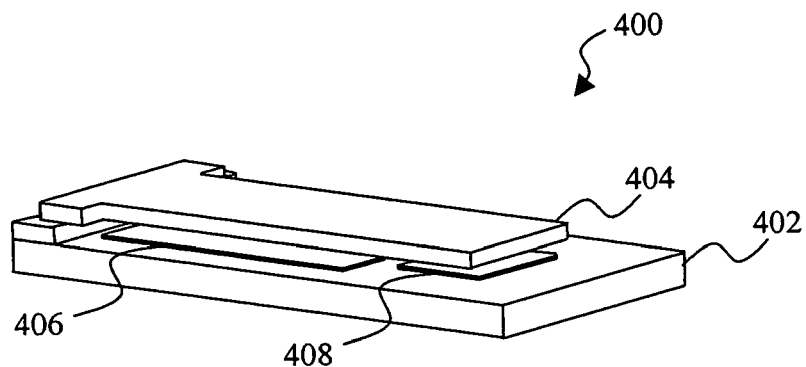
FIG. 4 is a perspective view of one embodiment of a microelectromechanical system (MEMS) that may be used to form one of the capacitors within the digitally tunable matching network of FIG. 2.

Referring to FIG. 4, one embodiment of a digitally tunable capacitor 400 is illustrated. The digitally tunable capacitor 400 is a microelectromechanical system (MEMS) and may be implemented on a substrate 402. Microelectromechanical systems (MEMS) integrate mechanical elements with electronic elements on a common semiconductor substrate using microfabrication technology. For example, the electronic components may be fabricated using CMOS, Bipolar, or BICMOS semiconductor manufacturing processes while the mechanical elements may be fabricated by micromachining processes that selectively etch away parts of the semiconductor wafer or add new structural layers. The digitally tunable capacitor 400 includes a cantilever 404 that extends over an actuator plate 406 and a stationary capacitor plate 408. The cantilever 404 may be rigid or flexible and may be positioned a predefined distance above the substrate 402 that is sufficient to ensure that the digitally tunable capacitor is OFF when the capacitor is not being actuated.

Figure 5A:
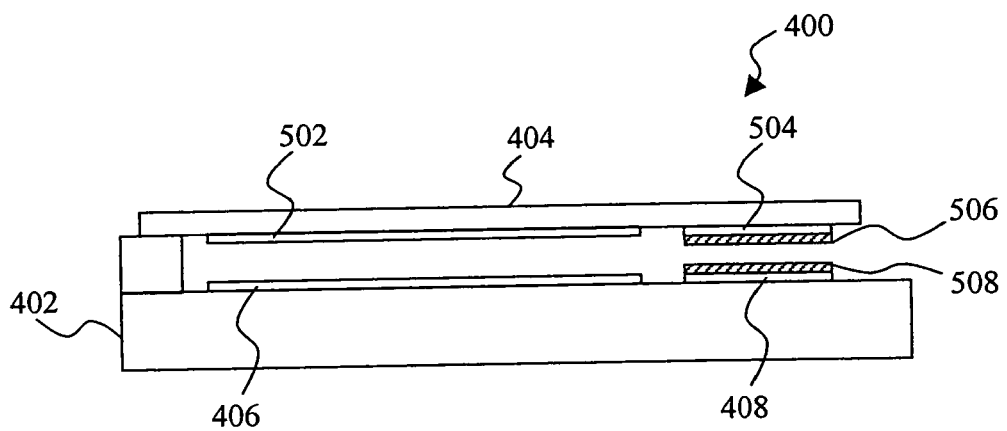
FIG. 5a is a side view of the MEMS of FIG. 4 in a non-actuated state.
Figure 5B:
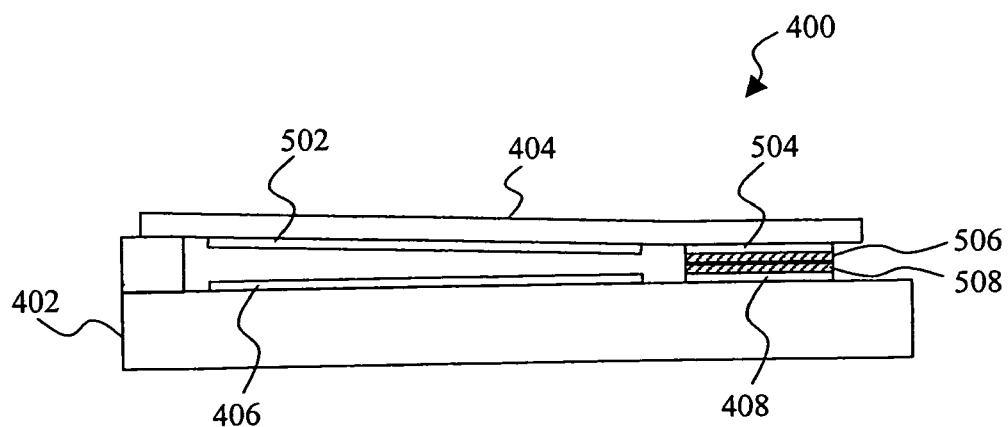
FIG. 5b is a side view of the MEMS of FIG. 4 in an actuated state.

With additional reference to FIGS. 5a and 5b, a side view of the digitally tunable capacitor 400 of FIG. 4 is provided. A second actuator plate 502 and a movable capacitor plate 504 are illustrated on the underside of the cantilever 404. The second actuator plate 502 is positioned above the actuator plate 406 and the movable capacitor plate 504 is positioned above the stationary capacitor plate 408. Each capacitor plate 408 and 504 may include a layer of dielectric material 508, 506, respectively, to separate the two dielectric plates when the cantilever is actuated. It is understood that the dielectric material may be formed on a single one of the capacitor plates 408 and 504, rather than on both plates.

Referring specifically to FIG. 5b, when the cantilever 404 is actuated, the distance between the capacitor plates 408 and 504 is reduced until the dielectric layers 508 and 506 are in contact. This position turns the digitally tunable capacitor 400 ON and enables it to contribute its capacitive value to an impedance matching network. Depending on the particular implementation of the MEMS, the actuation plates 406 and 502 may operate based on electrostatic, thermal, magnetic, piezo driven, or other mechanisms.

Figure 6:
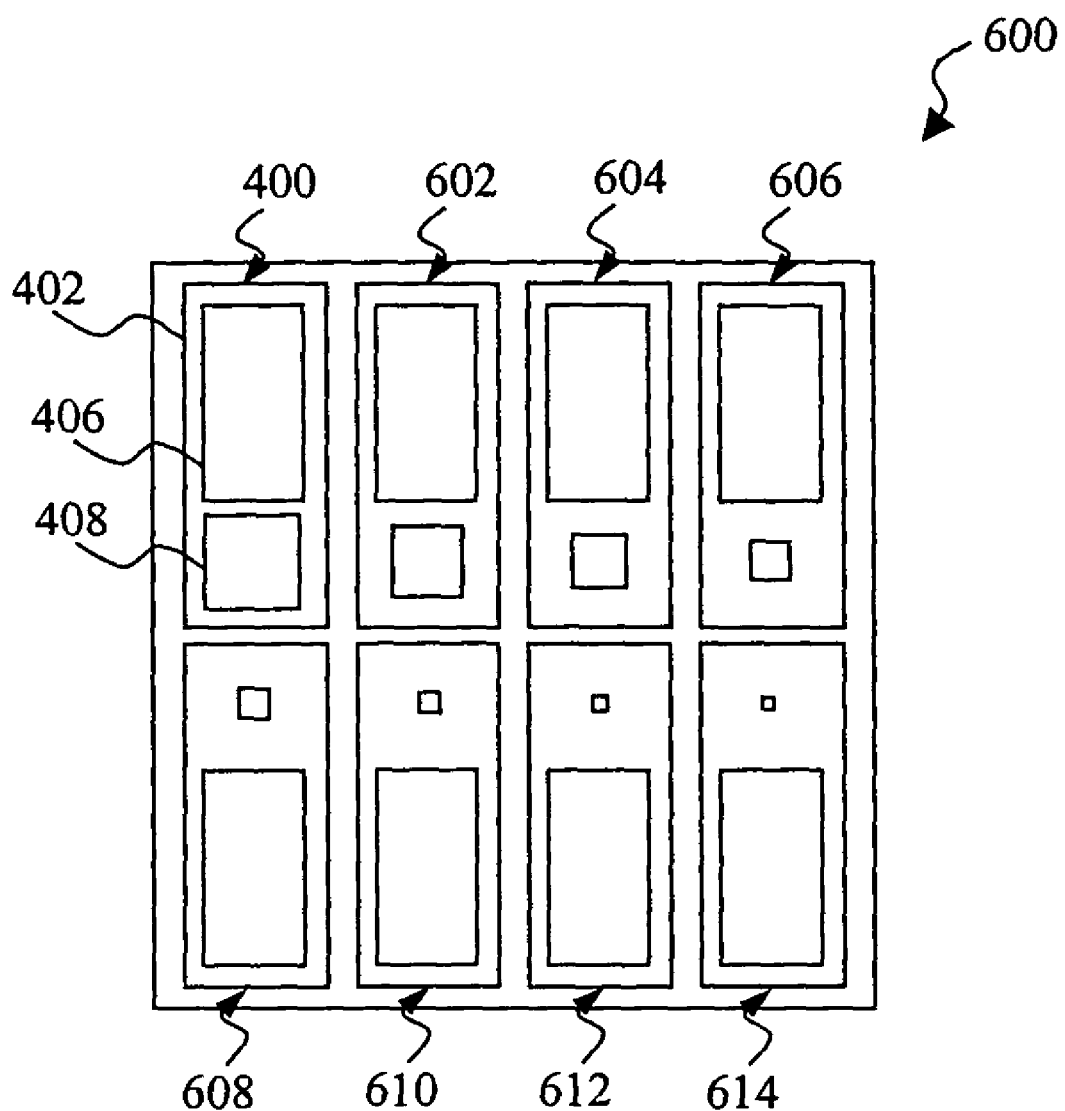
FIG. 6 is an overhead view of a capacitor-based digitally tunable matching network implementation of the circuit of FIG. 2 using a plurality of the MEMS of FIG. 4.

Referring to FIG. 6, one embodiment of a digitally tunable impedance network 600 is illustrated. The present example uses multiple MEMS as described with respect to FIG. 4, with the digitally tunable capacitor 400 of FIG. 4 serving as the largest capacitor in the digitally tunable impedance network 600. As can be seen by the decreasing size of each of the stationary capacitive plates, the capacitors 400, 602, 604, 606, 608, 610, 612, and 614 decrease in size from the largest digitally tunable capacitor 400 to the smallest digitally tunable capacitor 614. As there are a total of eight digitally tunable capacitors, the digitally tunable impedance network 600 may be represented by eight bits, as described previously. It is understood that the digitally tunable capacitors may be formed on a single substrate using processing steps that occur simultaneously with respect to the various capacitors.

Although the size of each stationary capacitive plate represents the capacitive value of each of the digitally tunable capacitors in the present example (with smaller plates representing lower values), it is understood that other methods for defining the capacitance may be used. For example, rather than varying the size of the stationary capacitive plates, variations may be made to the thickness of the dielectric layer(s) (e.g., 506 and 508 of FIG. 5a) used to separate the stationary and movable capacitive plates to alter the corresponding capacitance. Additionally, larger capacitive values may be achieved by ganging multiple small capacitive plates together, for example sharing a control signal between M capacitor structures, where each capacitor structure provides K capacitance to provide a total M×K capacitance.

Figure 7:
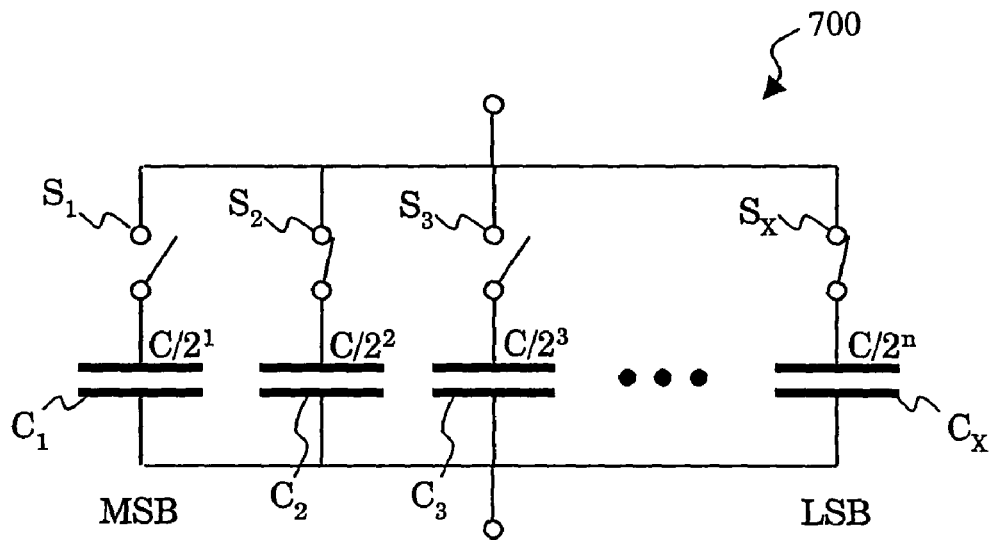
FIG. 7 is a circuit diagram of another embodiment of a capacitor-based digitally tunable matching network that may be used within the system of FIG. 1.

Referring to FIG. 7, a circuit 700 illustrates another embodiment of a digitally tunable matching network. In the present example, the circuit 700 is based on fixed capacitors $C_1, C_2, C_3, \ldots, C_X$ that may be turned either ON or OFF using corresponding switches $S_1, S_2, S_3, \ldots, S_X$, respectively. Each capacitor $C_1, C_2, C_3, \ldots, C_X$ is coupled in parallel to the other capacitors and has a predefined capacitive value that is related to the other capacitor values based on a fixed relationship. In the present example, this is a $2^n$ relationship. More specifically, the entire capacitive network is designed to have an overall capacitive value of C when all of the capacitors $C_1, C_2, C_3, \ldots, C_X$ are ON. The largest capacitor in the network ($C_1$) has a capacitive value of $C/2$ (or $C/2^n$ where n=1). Each capacitor decreases in size by a factor of two and the smallest capacitor in the network ($C_X$) provides the resolution of the network. For example, if the capacitor $C_X$ has a value of $C/2^n$ and n=8, then the smallest step size of capacitance allowed by the network is 1/256 of C. Therefore, the circuit 700 can provide a range of capacitances from approximately C/256 to C in steps of C/256.

In contrast to the circuit 200 of FIG. 2, the capacitors of the circuit 700 are fixed, and may be implemented using, for example, parallel plates, stacked parallel plates, interdigital fingers, or deep trench capacitors. Rather than actuating a movable plate to turn the capacitor ON or OFF, the corresponding switch may be used to close the circuit and include the capacitance provided by the associated capacitor in the impedance network. A digital controller (not shown) may be used to control the switches $S_1, S_2, S_3, \ldots, S_X$ using a binary format, with OFF=1 and ON=0 (or vice versa).

Figure 8:
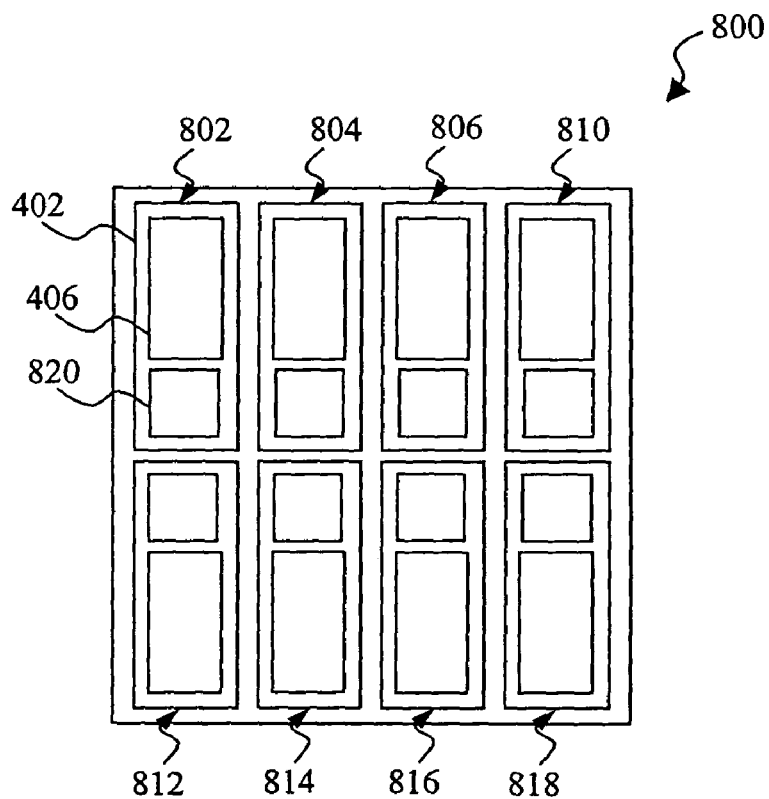
FIG. 8 is an overhead view of a capacitor-based digitally tunable matching network implementation of the circuit of FIG. 7.

Referring to FIG. 8, one embodiment of a digitally tunable impedance network 800 is illustrated as an implementation of the circuit 700 of FIG. 7. The impedance network 800 uses multiple MEMS similar to those described with respect to FIG. 4 except that each MEMS forms a switch rather than a capacitor. Accordingly, rather than having two capacitive plates, the MEMS of the present example has two contacts (contact 820 is shown) that close the circuit and turn the associated capacitor ON. Because the MEMS do not determine the capacitive value of each capacitor, the contacts of the MEMS may be equally sized.

A digital controller used to control the switches $S_1, S_2, S_3, \ldots, S_X$ may be integrated with the MEMS on the same substrate. Alternatively, the digital controller may be separate from the MEMS.

Referring to FIG. 9, a circuit 900 illustrates yet another embodiment of a digitally tunable matching network. In the present example, the circuit 900 is based on inductors $L_1, L_2, L_3, \ldots, L_X$ that may be turned either ON or OFF using corresponding switches $S_1, S_2, S_3, \ldots, S_X$, respectively. An inductor is turned off when the switch in parallel with the inductor is closed. Each inductor $L_1, L_2, L_3, \ldots, L_X$ is coupled in series to the other inductors and has a predefined inductive value that is related to the other inductive values based on a $2^n$ relationship. More specifically, the entire inductive network is designed to have an overall inductive value of L when all of the inductors $L_1, L_2, L_3, \ldots, L_X$ are ON. The largest inductor in the network ($L_1$) has an inductive value of $L/2$ (or $L/2^n$ where n=1). Each inductor decreases in size by a factor of two and the smallest inductor in the network ($L_X$) provides the resolution of the network. For example, if the inductor $L_X$ has a value of $L/2^n$ and n=8, then the smallest step size of inductance allowed by the network is 1/256 of L. Therefore, the circuit 900 can provide a range of inductances from approximately L/256 to L in steps of L/256. It is understood that L may be selected to be a slightly larger value than desired for the total inductance, as the above example may actually provide a maximum inductance of L−(L/256), rather than L.

The inductors of the circuit 900 have fixed values and, to turn an inductor ON or OFF, the corresponding switch $S_1, S_2, S_3, \ldots, S_X$ may be used. One or more digital controllers may be used to control the switches $S_1, S_2, S_3, \ldots, S_X$ and the controller may be integrated with the MEMS on the same substrate. Alternatively, the controller may be separate from the MEMS.

Referring to FIGS. 10a and 10b, one possible application for a digitally tunable impedance matching network is in a multi-band environment. As is known, reactance (both capacitive and inductive) varies based on the frequency of a signal. Accordingly, as illustrated in FIG. 10a, a multi-band device that handles the transmission of multiple frequencies $f_1, f_2, \ldots, f_n$ may include multiple impedance matching networks $MN_1, MN_2, \ldots, MN_N$ to handle the various frequencies. However, as illustrated in FIG. 10b, a single digitally tunable impedance matching network TMN may be substituted for the multiple impedance matching networks $MN_1, MN_2, \ldots, MN_N$ while enabling the multi-band device to handle the multiple frequencies. It is understood that some embodiments may use multiple digitally tunable impedance matching networks to achieve a desired impedance matching capability. For example, one digitally tunable impedance matching network may be used for a first range of frequencies, and another digitally tunable impedance matching network may be used for a second range of frequencies.

Figure 11:
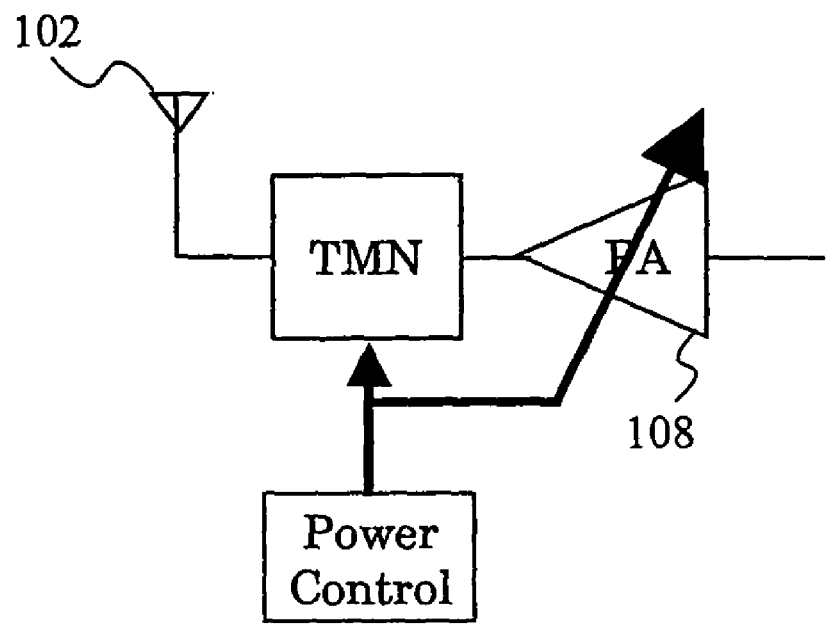
FIG. 11 is a diagram illustrating the use of a digitally tunable impedance matching network for impedance matching an amplifier in a variable load line environment.
Figure 12:
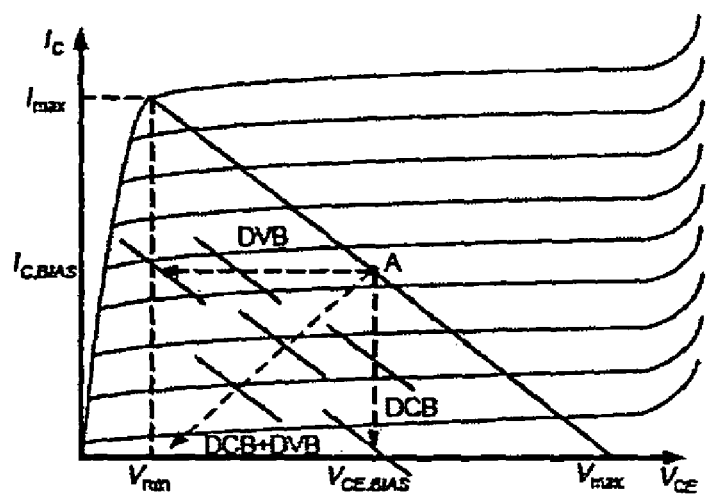
FIG. 12 is an exemplary chart illustrating load line variations based on bias current and/or bias voltage changes.

Referring to FIGS. 11 and 12, a digitally tunable impedance matching network TMN may be used for impedance matching in a variable load line environment. In the present example, a power control module provides input to both the PA 108 and the digitally tunable impedance matching network TMN. As is known, the drain bias of a power amplifier is generally coordinated with a signal envelope by altering the drain current and/or drain voltage, which may change the optimal load of the PA. As illustrated in FIG. 12, the load line may shift based on current, voltage, or a combination thereof. To address this shift, the digitally tunable impedance matching network TMN may be used to change the PA's load and optimize the PA's performance.

Figure 13A:
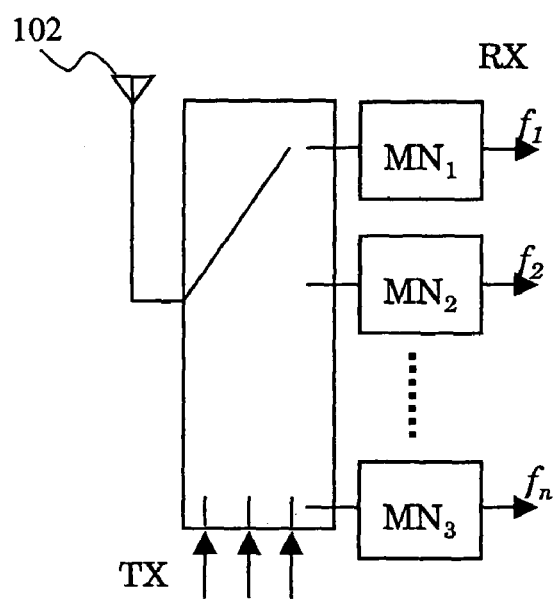
FIG. 13a is a diagram illustrating the use of multiple matching networks in a multi-band low noise amplifier environment.
Figure 13B:
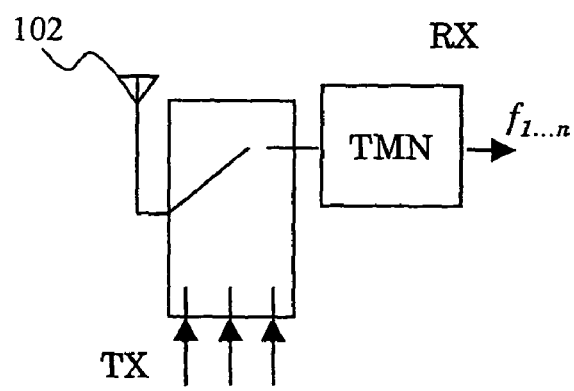

Referring to FIGS. 13a and 13b, one possible application for a digitally tunable impedance matching network is in a multi-band environment. As is known, reactance (both capacitive and inductive) varies based on the frequency of a signal. Accordingly, as illustrated in FIG. 13a, a multi-band device that handles the reception of multiple frequencies $f_1$, $f_2$, ..., $f_n$ may include multiple impedance matching networks $MN_1$, $MN_2$, ..., $MN_N$ to handle the various frequencies. However, as illustrated in FIG. 13b, a single digitally tunable impedance matching network TMN may be substituted for the multiple impedance matching networks $MN_1$, $MN_2$, ..., $MN_N$ while enabling the multi-band device to handle the multiple frequencies. It is understood that some embodiments may use multiple digitally tunable impedance matching networks to achieve a desired impedance matching capability. For example, one digitally tunable impedance matching network may be used for a first range of frequencies, and another digitally tunable impedance matching network may be used for a second range of frequencies.

It is understood that, although the examples described above use a factor of two for purposes of illustration, other factors may be used. In addition, other number systems other than binary may be desirable in certain circumstances. Accordingly, while a factor of two in a binary system where n increases in integer steps provides certain conveniences, other relationships may be used instead and the present disclosure should not be limited to the specific illustrations provided. Furthermore, the numbers need not be sequential in every case (e.g., $2^1$, $2^2$, $2^3$) as the use of non-sequential patterns (e.g., $2^2$, $2^4$, $2^6$, $2^7$) may provide benefits in some implementations. In addition, the sizes and ratios used herein (e.g., ½, ¼) may be varied based on factors such as design parameters and manufacturing criteria, and are understood to be approximate due to inconsistencies in manufacturing processes and similar issues. It is also understood that a digitally tunable impedance matching network may combine capacitive and inductive elements described above in one network.

Although some embodiments may or may not have some or all of the advantages listed below, the present disclosure may provide various advantages through the use of digitally tunable impedance matching networks. For example, quantized values of tunable capacitors and inductors may improve the accuracy and repeatability of digitally tunable impedance matching networks. For example, an array of eight capacitors configured in a binary array of octave steps provides a capacitive tuning range of seven octaves in two hundred and fifty-six steps. The settable range, accuracy, and repeatability of such a capacitor array may exceed that of a component such as a varactor diode. The flexibility in design and component requirements may enable digitally tunable impedance matching networks to match a wide range of impedances. As each component's contribution may be quantized, either fully in-circuit or fully out-of-circuit, a digitally tunable impedance matching network may not introduce phase noise into a system as is often the case using a continuously-tuned analog component such as a varactor diode. The use of MEMS devices may provide high power handling capabilities and low signal transmission losses due to the high linearity and low insertion loss of a MEMS device in comparison to a component such as a varactor diode. Furthermore, the use of MEMS devices may provide the advantage of a small footprint that is desirable in cell phones and other portable electronic devices.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. An impedance matching system comprising:
  a digitally tunable impedance matching network having a maximum capacitance C, the network including:
  a first capacitor having a fixed plate and a moveable plate configured to be in a first position or a second position, wherein the first capacitor provides a first predefined value of capacitance when the movable plate is in the first position and an open circuit when the movable plate is in the second position; and
  a second capacitor coupled in parallel to the first capacitor and having a fixed plate and a moveable plate configured to be in a first position or a second position, wherein the second capacitor provides a second predefined value of capacitance when the movable plate is in the first position and an open circuit when the movable plate is in the second position; and
  a digital controller coupled to the first and second capacitors and configured to actuate the moveable plate of one or both of the first and second capacitors to produce a capacitance in the range of zero to the sum of the first and second predefined values of capacitance.

2. The impedance matching system of claim 1 wherein the digital controller actuates the moveable plate of one or both of the first and second capacitors by setting a single bit associated with each of the first and second capacitors.

3. The impedance matching system of claim 1 further comprising:
  a third capacitor coupled in parallel to the first and second capacitors and having a fixed plate and a moveable plate configured to be in a first position or a second position, wherein the third capacitor provides a third predefined value of capacitance when the movable plate is in the first position and an open circuit when the movable plate is in the second position, wherein the digital controller is configured to actuate the moveable plate of one or more of the first, second, and third capacitors to produce a capacitance in the range of zero to the sum of the first, second and third predefined values of capacitance.

4. The impedance matching system of claim 3 further comprising fourth, fifth, sixth, seventh, and eighth capacitors, each coupled in parallel to the first, second and third capacitors and having a fixed plate and a moveable plate configured to be in a first position or a second position, wherein the fourth, fifth, sixth, seventh, and eighth capacitors provide fourth, fifth, sixth, seventh, and eighth predefined values of capacitance, respectively, when the movable plate of the respective capacitor is in the first position and an open circuit when the movable plate of the respective capacitor is in the second position, and
  wherein the digital controller is configured to actuate the moveable plate of one or more of the first through eighth capacitors to produce a capacitance in the range of zero to the sum of the first, second, third, fourth, fifth, sixth, seventh, and eighth predefined values of capacitance.

5. The impedance matching system of claim 1 wherein each of the first and second capacitors is a microelectromechanical system (MEMS) integrated into a common substrate.

6. The impedance matching system of claim 5 wherein the digital controller is integrated into the common substrate.

7. The impedance matching system of claim 5 wherein each of the MEMS comprises:
the fixed plate;
the movable plate; and
an actuator coupled to the digital controller, wherein the digital controller is configured to actuate the moveable plate via the actuator.

8. The impedance matching system of claim 7 wherein the actuator is configured to move a cantilever to which the movable plate is attached when actuated and, upon actuation, to force the movable plate towards the fixed plate by means of the cantilever.

9. An impedance matching network configured to produce a maximum reactance value of X comprising:
a plurality of N reactive elements each having an associated reactance value, wherein the reactance values of the reactive elements decrease from a first reactive element to a last reactive element of the plurality of reactive elements and the reactance value of each reactive element is smaller than the reactance value of the next largest reactive element by a predetermined factor K, and wherein each of the reactive elements is coupled to a controller and configured to be individually actuated by the controller to tune the impedance matching network to have a reactance value ranging from approximately zero to X in steps of approximately $X/K^N$.

10. The impedance matching network of claim 9 wherein the reactive elements include one or more binary capacitor arrays, binary inductor arrays, fixed capacitors, fixed inductors, or any combination thereof.

11. The impedance matching network of claim 9 wherein the reactive elements are inductors coupled in series, and wherein the impedance matching network further comprises a switch associated with each of the plurality of inductors and coupled to the digital controller, wherein actuation by the digital controller closes each switch and connects the inductor to the impedance matching network to provide the inductor's inductance to the impedance matching network.

12. The impedance matching network of claim 9 wherein each of the reactive elements is configured for control by the digital controller using a single bit.

13. The impedance matching network of claim 9 wherein each of the reactive elements is a microelectromechanical system (MEMS) integrated into a common substrate.

14. The impedance matching network of claim 9 wherein the reactive elements are capacitors coupled in parallel.

15. The impedance matching network of claim 14 wherein each of the capacitors includes a fixed plate positioned opposite a movable plate, and wherein actuation by the digital controller moves the movable plate towards the fixed plate and connects the capacitor to the impedance matching network to provide the capacitor's capacitance to the impedance matching network.

16. The impedance matching network of claim 14 further comprising a switch associated with each of the plurality of capacitors and coupled to the digital controller, wherein actuation by the digital controller closes each snitch and connects the capacitor to the impedance matching network to provide the capacitor's capacitance to the impedance matching network.

17. The impedance matching network of claim 16 wherein the digital controller is included within the impedance matching network and is formed on the common substrate.

18. A system for receiving and transmitting information comprising:
an antenna;
a front-end module coupled to the antenna;
a low noise amplifier coupled to the front-end module to form a reception path for information received from the antenna;
a power amplifier coupled to the front-end module to form a transmission path for information sent to the antenna; and
a digitally tunable impedance matching circuit coupled between the front-end module and at least one of the antenna, the low noise amplifier, and the power amplifier, wherein the digitally tunable impedance matching circuit has a maximum reactance value of X and is comprised of a plurality of N reactive elements having sequential reactance values differing by a factor of K and ranging from a largest reactance value of X/K to a smallest reactance value of $X/K^N$, wherein N>=2.

19. The system of claim 18 further comprising a digital controller coupled to the digitally tunable impedance matching network and configured to actuate individual ones of the plurality of reactive elements to produce a reactance of between approximately X/K and $X/K^N$.

20. The system of claim 19 wherein the plurality of reactive elements are capacitors and each capacitor is a microelectromechanical system (MEMS) configured with a fixed capacitive plate and a moveable, capacitive plate, and wherein actuation of one of the plurality of capacitors by the digital controller moves the moveable capacitive plate toward the fixed capacitive plate and provides the capacitor's capacitance to the digitally tunable impedance matching network.

21. The system of claim 20 wherein the MEMS and the digital controller are formed on a common substrate.

* * * * *